(12) United States Patent
Liu et al.

(10) Patent No.: US 11,063,600 B1
(45) Date of Patent: Jul. 13, 2021

(54) MULTI-STAGE CLOCK GENERATOR USING MUTUAL INJECTION FOR MULTI-PHASE GENERATION

(71) Applicant: Apple Inc., Cupertino, CA (US)

(72) Inventors: Wenbo Liu, Cupertino, CA (US); Wei-Ming Lee, San Jose, CA (US); Sanjeev K. Maheshwari, Fremont, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/929,995

(22) Filed: Jul. 15, 2020

(51) Int. Cl.
| | |
|---|---|
| *H03L 7/099* | (2006.01) |
| *H03K 3/03* | (2006.01) |
| *H03L 7/191* | (2006.01) |

(52) U.S. Cl.
CPC ......... *H03L 7/0998* (2013.01); *H03K 3/0315* (2013.01); *H03L 7/0997* (2013.01); *H03L 7/191* (2013.01)

(58) Field of Classification Search
CPC .............................. H03L 7/0995; H03L 7/0998
See application file for complete search history.

(56) References Cited

U.S. PATENT DOCUMENTS

| | | | | |
|---|---|---|---|---|
| 6,137,369 | A * | 10/2000 | Kermani | H03K 3/0315 331/45 |
| 7,315,219 | B2 | 1/2008 | Chiang | |
| 8,089,319 | B2 * | 1/2012 | Kaneko | H03K 3/0315 331/57 |
| 8,130,608 | B2 | 3/2012 | Matsumoto et al. | |
| 8,289,086 | B2 | 10/2012 | Chen et al. | |

FOREIGN PATENT DOCUMENTS

WO 2017134023 8/2017

* cited by examiner

*Primary Examiner* — Hai L Nguyen
(74) *Attorney, Agent, or Firm* — Kowert, Hood, Munyon, Rankin & Goetzel, P.C.; Erik A. Heter

(57) ABSTRACT

A multi-stage clock generation circuit is disclosed. The circuit includes first and second ring oscillators. The ring oscillators include a corresponding plurality of delay elements coupled in series, with a plurality of shunt circuits in parallel with corresponding inverters. The shunt circuits include respective interpolation nodes, which are resistively coupled to input and output nodes of their corresponding inverters. The interpolation nodes of the first ring oscillator are coupled to delay element input and output nodes of the second ring oscillator. Similarly, the interpolation nodes of the second ring oscillator are coupled to delay element input and output nodes of the first ring oscillator.

20 Claims, 6 Drawing Sheets

MULTI-STAGE CLOCK GENERATOR USING MUTUAL INJECTION FOR MULTI-PHASE GENERATION

BACKGROUND

Technical Field

This disclosure is directed to electronic circuits, and more particularly, to oscillator circuits.

Description of the Related Art

Ring oscillators are commonly used in a wide variety of electronic circuits that utilize periodic signals. A periodic signal provided from a ring oscillator may be used in applications such as sampling in a communications system, as a clock signal in various types of synchronous circuits, and so on. Ring oscillators implemented with inverters (or more generally, inverting circuit) may be very area efficient. Additionally, inverter-based ring oscillators may be more robust to variations than oscillators implemented using an LC (inductive-capacitive) tank circuit.

SUMMARY

A two-stage clock generation circuit is disclosed. In one embodiment, the circuit includes first and second ring oscillators. The ring oscillators include a corresponding plurality of delay elements coupled in series, with a plurality of shunt circuits in parallel with corresponding inverters. The shunt circuits include respective interpolation nodes, which are resistively coupled to input and output nodes of their corresponding inverters. The interpolation nodes of the first ring oscillator are coupled to delay element input and output nodes of the second ring oscillator. Similarly, the interpolation nodes of the second ring oscillator are coupled to delay element input and output nodes of the first ring oscillator.

In one embodiment, the delay elements are inverters, although other types of delay elements are possible and contemplated. A shunt circuit implemented in parallel with an inverter includes a first resistor having a terminal coupled to the inverter input, and a second resistor having a terminal coupled to the inverter output. The first and second resistors are coupled to one another at the interpolation node. The ring oscillators may be considered to be made up of phase generation elements that include the inverter and the first and second resistors of the shunt circuit. A signal on the input of an inverter may have a first phase value, while a signal on the inverter output may have a second phase value, which may be more than 180° delayed from the first phase value. A signal on the interpolation node may have a third phase value. A phase difference between the first and third signals may be substantially equal to a phase difference between the second and third signals.

Using various embodiments of the arrangement discussed above, the clock generation circuit may generate 2N clock signals having different phases with respect to one another, wherein N is an integer value equal to the number of phase generation elements in a given one of the first and second ring oscillators.

BRIEF DESCRIPTION OF THE DRAWINGS

The following detailed description makes reference to the accompanying drawings, which are now briefly described.

Figure 1:
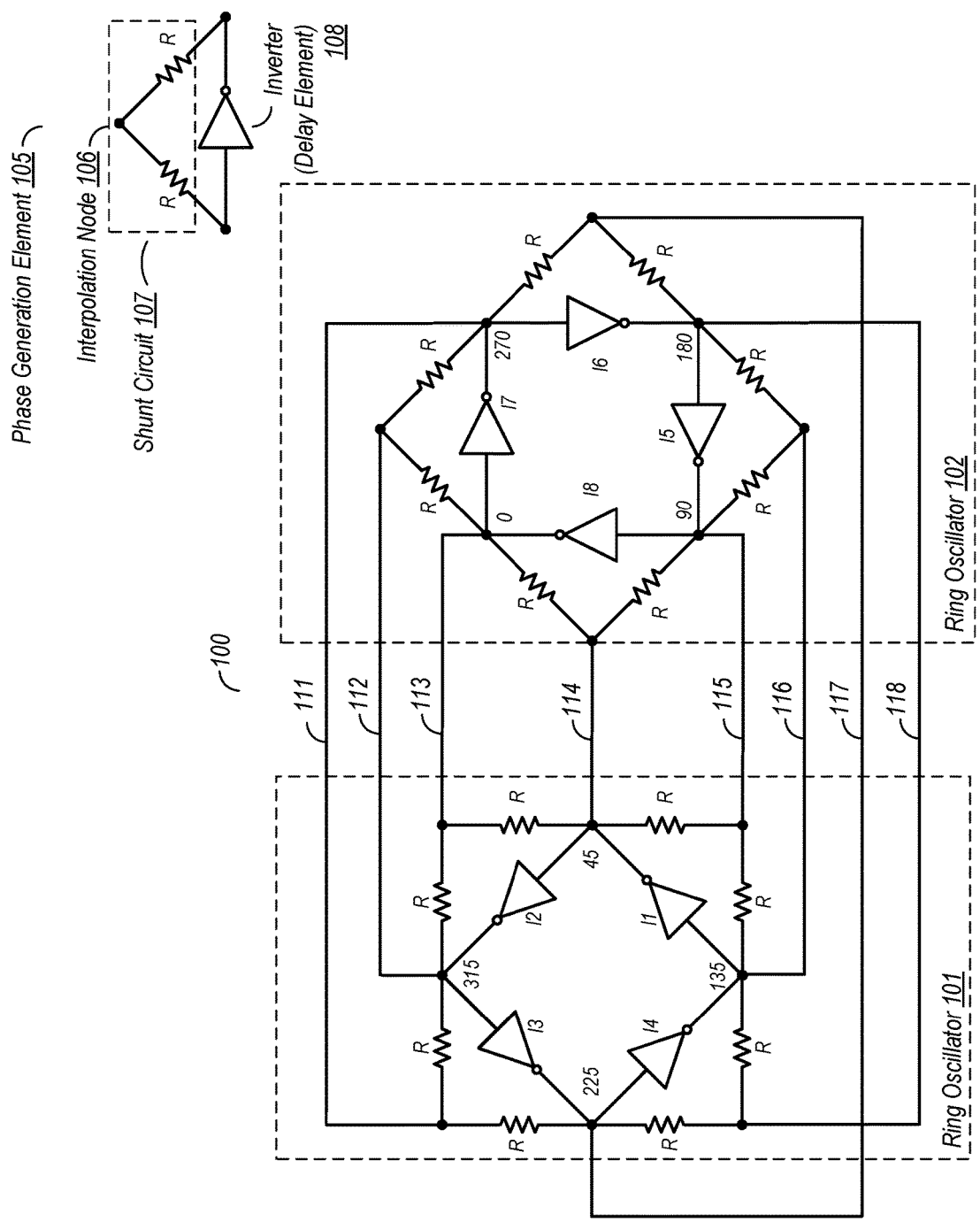
FIG. 1 is a schematic diagram of one embodiment of a multi-phase clock generation circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be desctibed or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed. FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a two-state clock generator using mutual injection for multi-phase clock signal generation. Multi-phase frequency synthesis and clock signal generation is widely used in modern communication systems. Such systems can include time-interleaved sampling systems (e.g., serializer-deserializer, or SERDES systems), clock and data recovery (CDR) circuit, and so on. Ring oscillators can be used for multi-phase generation, are area efficient, and are less susceptible to variations (e.g., process, voltage, temperature) than oscillators based on LC tank circuits. However, in many ring oscillator-based multi-phase clock generation circuits have an inverse relationship between the number of phases that can be generated and the frequency of the signals that can be produced. For example, a clock generation circuit based on a four-stage ring oscillator, while capable of generating eight different phases, is limited by a four-inverter gate delay. Similarly, an eight-stage ring would be limited by an eight-inverter gate delay.

In the present disclosure, a mutual-injection technique is utilized to implement various embodiments of a ring oscillator-based clock generation circuit capable of generating multiple phases. The mutual-injection technique used herein results in a clock generation circuit in which the frequency of the output signals and the number of phases generate are independent of one another.

In various embodiments, the clock generation may utilize two different N-stage ring oscillators to generate 2N output clock signals in 2N phases that are substantially evenly spaced. Each of the ring oscillators includes N delay elements (e.g., inverters) coupled in a series/ring configuration, each with a corresponding shunt circuit coupled in parallel therewith. The ring oscillators may be alternatively characterized as having N phase elements, where each of the phase elements includes a delay element (e.g., an inverter) and a shunt circuit coupled in parallel. The shunt circuit may be implemented with a pair of resistors, with one coupled to an input of a delay element and one coupled to an output of the same delay element. The two resistors are coupled to one another at a node referred to herein as an interpolation node. The nodes in a given ring oscillator where the input of one delay element is coupled to an input of another delay element may be referred to herein as an input/output (I/O) node. The interpolation node of a given shunt circuit in a first one of the ring oscillators is coupled to an I/O node of a second one of the ring oscillators. Through this coupling, the two ring oscillators exchange energy with one another and thus produce 2N clock signals being substantially equal in frequency and in 2N different phases. Various embodiments of such circuits are now discussed in further detail below.

FIG. 1 is a schematic diagram of one embodiment of a multi-phase clock generation circuit. In embodiment shown, clock generation circuit 100 includes ring oscillators 101 and 102, which are coupled to one another via nodes 111-118. Ring oscillator 101 in this embodiment includes four inverters, I1-I4, coupled to one another in a series-coupled ring. Similarly, ring oscillator 102 includes four inverters I5-I8 which are also coupled to one another in a series-coupled ring. Since, in this particular embodiment, there are four inverters in ring oscillators 101 and 102, N=4, with clock generation circuit 100 producing 2N=8 different clock signals that have a unique phase with respect to each other. Furthermore, the phases may be substantially equally spaced with respect to one another.

Each of the inverters shown in FIG. 1 includes a shunt circuit 107 coupled in parallel therewith (between its input and output nodes). Each shunt circuit 107 includes a pair of resistors R (which may be of substantially equal resistance value) coupled to one another at a node referred to herein as an interpolation node 106. The interpolation node, for the purposes of this disclosure, is defined as a node in the shunt circuit 107, separate from the input and output nodes of the corresponding inverter (or delay element) 108 upon which the signal thereon has an interpolated value that is between the respective phases of signals on the input and output nodes. In the embodiment shown in FIG. 1, interpolation node 106 is the node coupled between the two resistors R.

Ring oscillators 101 and 102 may be alternatively characterized as having a number of phase generation elements 105. Each of the phase generation elements includes an inverter (or more generally, delay element) 108, which a shunt circuit 107 coupled in parallel therewith. The shunt circuit includes a first resistor R having a first terminal coupled to an input of inverter 108, while a first terminal of a second resistor R is coupled to an output of inverter 108. The two resistors R are coupled to one another at an interpolation node 106. The phases of the periodic signals in each of the nodes of phase generation element 106 may be different from one another. In one embodiment, the phase of a periodic signal on interpolation node 106 may be approximately halfway between the phase of the input and output nodes of inverter 108.

In this particular embodiment, ring oscillator 100 is arranged to produce clock signals at four different phases, 45°, 135°, 225°, and 315°. These phases are generated on I/O nodes of ring oscillator 101, each of which is coupled to an output of one inverter and an input of a subsequent inverter in the ring. Ring oscillator 102 is arranged to produce clock signals at phases of 0°, 90°, 180°, and 270°. The clock signals having phases of 45°, 135°, 225°, and 315° can be taken from nodes 114, 116, 117, and 112, respectively. The clock signals having phases of 0°, 90°, 180°, and 270° can be taken from nodes 113, 115, 118, and 111, respectively. With respect to nodes 114, 116, 117, and 112, each is coupled to an interpolation node in ring oscillator 101 and an I/O node in ring oscillator 102. Conversely, nodes 113, 115, 118, and 111 are coupled to corresponding I/O nodes in ring oscillator 101 and corresponding interpolation nodes in ring oscillator 102.

In the embodiment shown, the phase delay between an input and an output of a given inverter is more than 180°. Thus, the state of an input signal to a given inverter in clock generation circuit 100 is not always a logical complement to the state of its output signal. For example, the phase of the input signal on inverter I1 in the illustrated embodiment is 135°, while the phase of the output signal from this same inverter is 45°. Accordingly, there is a 90° phase difference between the input and output signals of inverter. With respect to the shunt circuit 107 in parallel with inverter I1, a signal on node 115 (which is coupled to the interpolation node of that shunt circuit) has a phase of 90°, half the phase distance between 135° and 45°. Generally speaking, the phase of a signal on an interpolation node is approximately halfway between the respective phases of signals on its corresponding inverter's input and output nodes.

The coupling of ring oscillator 101 to ring oscillator 102 as shown here, namely by coupling the I/O nodes of one ring oscillator to the interpolation nodes of the other one, allows for the two ring oscillators to exchange energy with one another. For example, energy from a signal output from an inverter in one ring oscillator may be injected into the other via a correspondingly coupled interpolation node. This in turn may aid in bringing the frequency and respective phases of the output signals to stable values.

Figure 2:
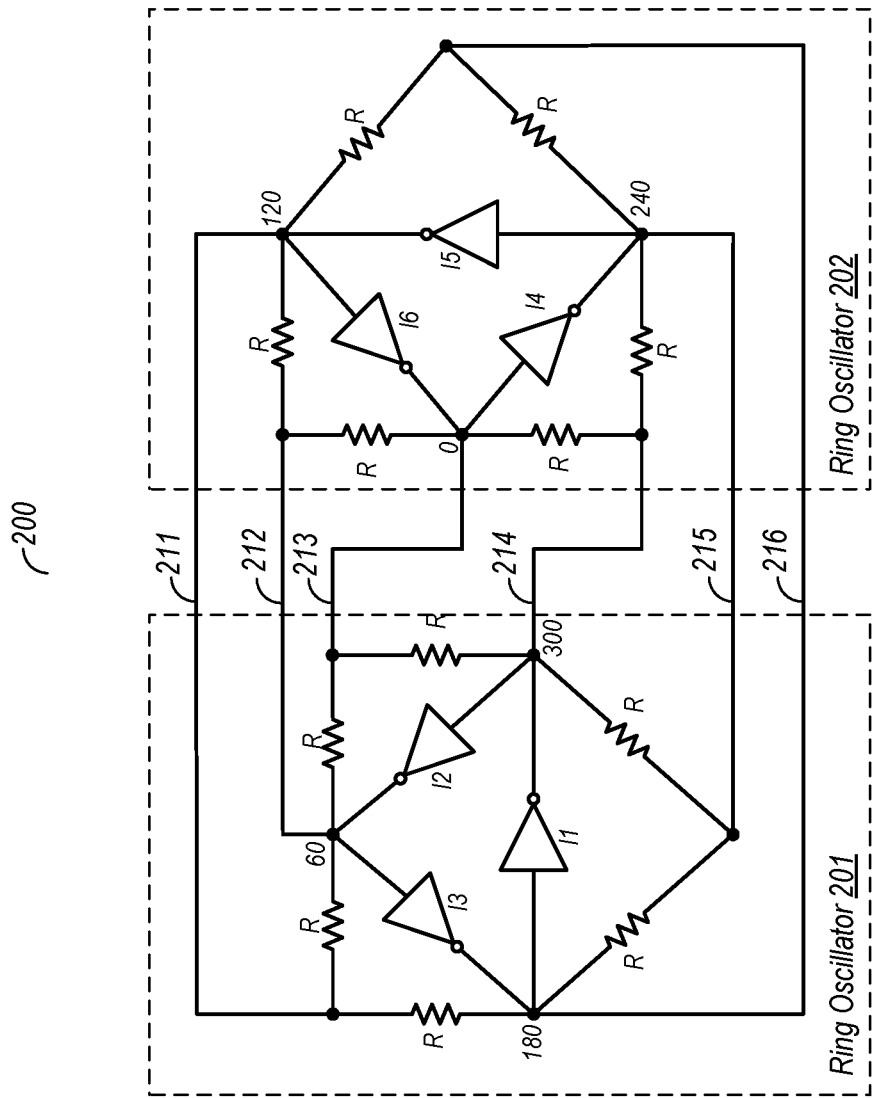
FIG. 2 is a schematic diagram of another embodiment of a multi-phase clock generation circuit.

FIG. 2 is a schematic diagram of another embodiment of a multi-phase clock generation circuit. In this particular embodiment, clock generator circuit 200 includes ring oscillator 201 and ring oscillator 202. These two ring oscillators are coupled to one another in a manner similar to that of the example shown in FIG. 1. Each of the ring oscillators includes three inverters. Ring oscillator 201 includes inverters I1, I2, and I3, while ring oscillator 202 includes inverters I4, I5, and I6. The inverters in both ring oscillators are couple in parallel with a corresponding shunt circuit including two resistors R coupled to one another at an interpolation node. The interpolation nodes of the shunt circuits in a given one of ring oscillators 201 and 202 is are coupled to corresponding I/O nodes in the other one of the ring oscillators 201 and 202.

The output nodes of the inverters in ring oscillator generate signals having phases of 60°, 180° and 300°. In ring oscillator 202, output signals are generated having phases of 0°, 120°, and 240°. Nodes 211-216 are coupled between ring oscillators 201 and 202, each coupling an I/O node of one ring oscillator to an interpolation node of the other.

Generally speaking, the number of inverters (or more broadly, delay elements) used in the ring oscillators for various embodiments of a clock generator circuit in accordance with this disclosure may vary from one embodiment to the next. Any suitable number may be used, and may correspond to the number of desired output signals (and thus, number of different phases produced). Generally speaking, the present disclosure contemplates using two ring oscillators each having N elements to generate 2N periodic output signals in 2N unique phases, where N is an integer value. The arrangement that shown in FIGS. 1 and 2 may thus be extended to different values of N. Furthermore, embodiments of a clock generation circuit falling within the scope of this disclosure, including the examples of FIGS. 1 and 2, may be implemented such that N is independent of the desired output frequency of the 2N clock signals that are generated. This may allow clock generator circuits in accordance with this disclosure to have a large number of phases at high frequencies.

Figure 3:
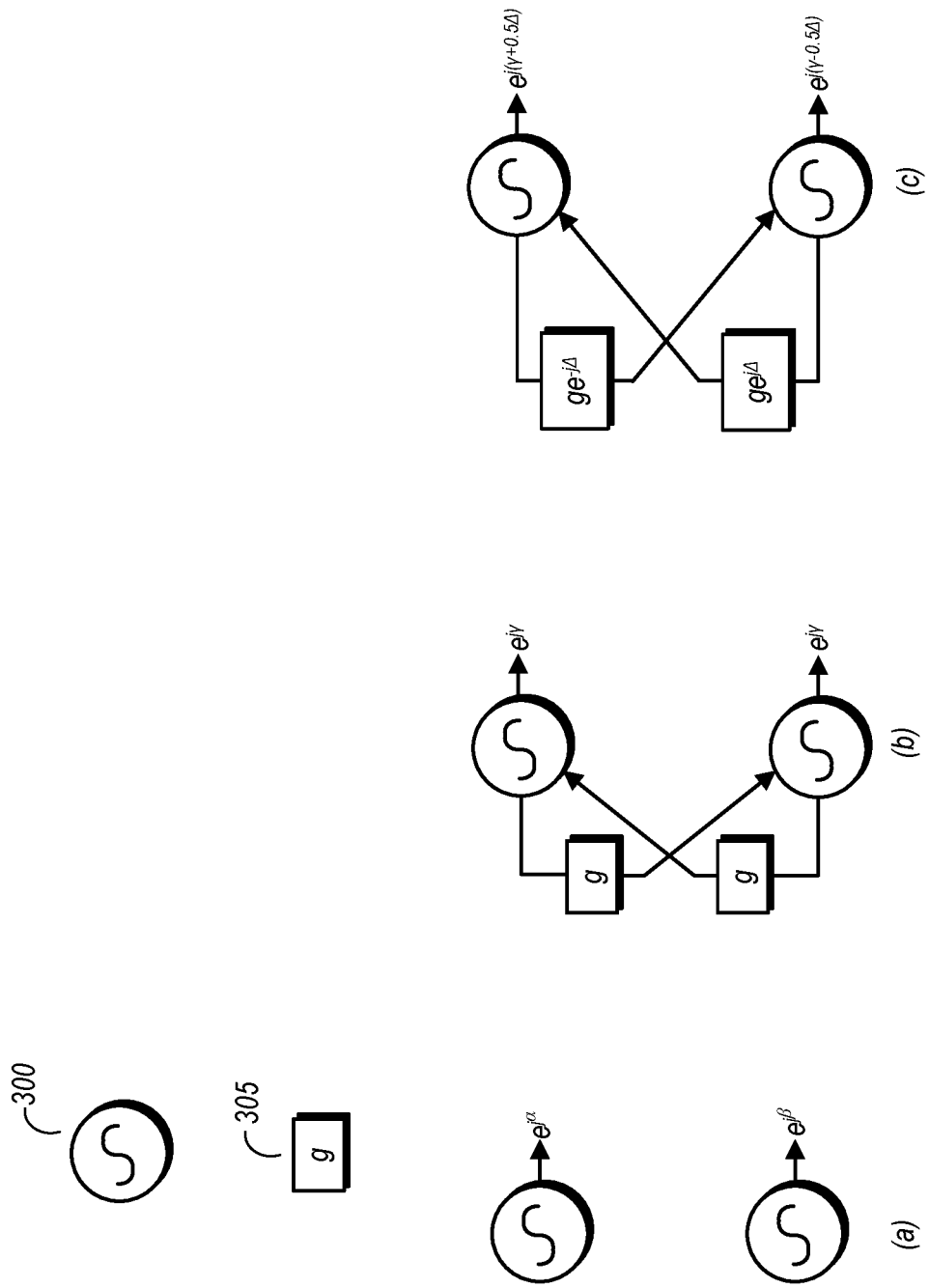
FIG. 3 is a diagram illustrating mutual injection for controlling phases of one embodiment of a multi-phase clock generation circuit.

FIG. 3 is a diagram illustrating mutual injection for controlling phases of one embodiment of a multi-phase clock generation circuit. This example uses two ring oscillators 300 and two energy exchange circuits 305 (which may correspond to, e.g., one or more instances of the shunt circuits 107 shown in FIGS. 1 and 2.

In particular, FIG. 3 illustrates one of the principles upon which the clock generator circuits operate in accordance with this disclosure. In (a), two substantially identical ring oscillators 300 are implemented, a first of which outputs a signal characterized by $e^{j\alpha}$ and the second outputting a signal characterized by $e^{j\beta}$. Ideally, these two ring oscillators operate at the same frequency. Device mismatches between the two ring oscillators may result in a small frequency difference (0.1% or less) of their respective output signals, hence the difference in the mathematical expressions characterizing the same. More importantly, their phases may be different due to the device mismatches, different reset states, different time instances to release the reset signals, and so on.

In (b), the two ring oscillators 300, via energy exchange circuit 305, exchange a portion of the energy generated by each. By injecting energy from one ring oscillator 300 into the other, the frequency and phase of the respective output signals may be brought to the same steady state values, characterized by $e^{j\gamma}$. Since the frequency mismatch is relatively small between the output signals as shown in (a), a small amount of energy exchange may be sufficient to lock the output signals to the same steady state frequency and phase values.

In (c), a phase shift intentionally added into the exchange results in a controlled phase difference between two oscillators with the identical frequency maintained. In particular, a first phase shift $ge^{-j\Delta}$ is added to one of the output signals, while a second phase shift $ge^{j\Delta}$ is added to the other one of the output signals. This results in output signals characterized by the mathematical $e^{j(\gamma+0.5\Delta)}$ and $e^{j(\gamma-0.5\Delta)}$.

The principle illustrated in FIG. 3 can be applied to the various embodiments discussed above, such as that of FIG. 1 in which two ring oscillators are coupled to generate output signals in eight different, unique phases, and may maintain a high oscillation frequency. For example, the clock generator circuit 100 of FIG. 1 utilizes four single-ended inverters series-coupled into a loop. Similar to any even number stage ring oscillators, two inverted phases have an appropriately sized latch, like back to back inverters, to ensure sustainable oscillation. In each ring oscillator of FIG. 1, the phase difference between the input and the output of an inverter is 90°. Adding a shunt circuit in parallel with a given inverter using two resistors connected at the middle point referred to as an interpolation node, an interpolated phase is generated for a signal on that node, which is separated from the phase of the inverter input and output signals by 45° each. Due to unequal driving capability, utilizing the phases on the interpolation nodes may not be possible. Accordingly, the interpolation nodes of each of the ring oscillators are coupled to I/O nodes of another ring oscillator. These connections serve two purposes: forming energy exchange between the two ring oscillator, and regulating the 45° degree phase shift between two ring oscillators. In this arrangement nodes coupled between the two ring oscillators have substantially equal driving capability and can be buffered for external usage.

A similar principle can be applied to the embodiment of FIG. 2, although the odd number of inverters in each ring oscillator of that example does not result in a latch being formed by inverter pairs. However, the energy exchange between the two ring oscillators may stabilize the frequency of the output signals generated by both while stabilizing the phase relationships to generate the output signals in the corresponding number of phases.

Accordingly, in practical implementations, the two ring oscillators of a given clock generator circuit as disclosed herein may be two instantiations of a single ring oscillator design such that a frequency mismatch between the two is very small. The mutual injection performed using the coupling of interpolation nodes (of the shunt circuits) of one ring oscillator to the I/O nodes of the other may result in the need for a small pull-in range, which may translate into large resistor impedances and fewer crossbar currents. The mutual injection may apply an averaging effect on the two ring oscillator's low frequency phase noise. Accordingly, the design shown herein may be implemented without the noise penalty that is present in other designs of a clock generation circuit utilizing two ring oscillators.

In addition to those discussed above, other variants of the clock generation circuit disclosed herein are possible and contemplated. For example, the delay units may be a CMOS inverter or any CML (common mode logic)-type buffer. Control of the frequency of the generated clock signals may be performed using voltage control (e.g., frequency varies with voltage) or current control (e.g., frequency varies with current). The resistors of the shunt circuits may be implemented using actual resistors in some embodiments, as well as transmission gates in other embodiments, and more generally, any suitable type of resistive element. As per the respective examples of FIGS. 1 and 2, the number of delay elements may be even or odd. Furthermore, embodiments having an odd number of ring oscillators are also possible and contemplated. The transistors used to implement a ring oscillator in accordance with this disclosure may be any suitable type, including (but not limited to) CMOS transistors, FinFETs, bipolar transistors, and so on.

Figure 4:
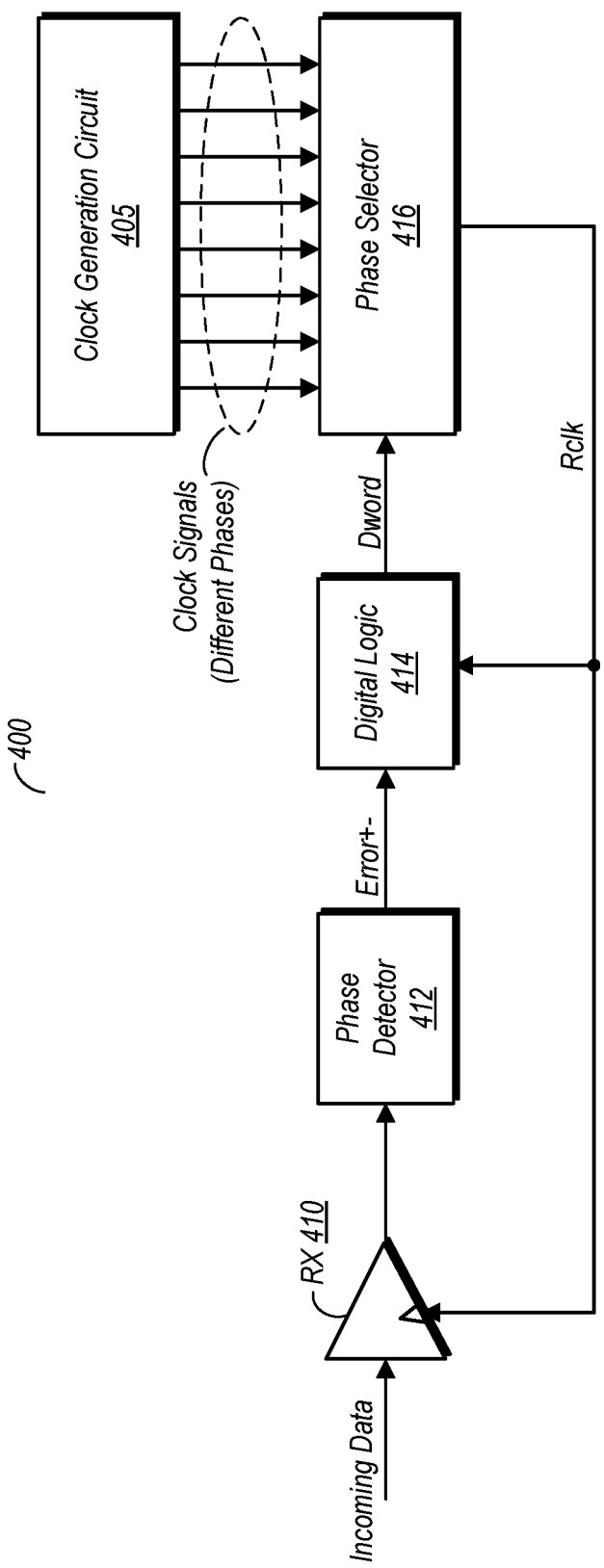
FIG. 4 is a block diagram of an example clock and data recovery (CDR) system that utilizes an embodiment of a multi-phase clock generation circuit.

FIG. 4 is a block diagram of an example clock and data recovery (CDR) system that utilizes an embodiment of a multi-phase clock generation circuit. This example is provided to illustrate one possible application of a clock generator circuit in accordance with this disclosure. However, the example is not intended to be limiting, and thus the clock generator circuit as disclosed herein may utilized in any application in which multiple clock signals of the same frequency but different phases is desired.

In the embodiment shown, CDR circuit includes a receiver 410, which receives incoming data, which includes clocking information embedded therein. The output of receiver 410 in provided to phase detector 412. In one embodiment, phase detector 412 is a bang-bang phase detector that uses sampled data to generate a sign of the phase error between the clock signal provided to receiver 410 and the incoming data, generating an error signal, Error+−. The digital logic circuit 414 receives this error signal from phase detector 410 and generates a corresponding digital control word, Dword. This control word is provided to phase selector circuit 416. In the embodiment shown, phase selector circuit 416 is coupled to receive a number of different clock signals from clock generation circuit 405. These clock signals may have the same frequency as one another. However, each of these clock signals has a different, unique phase, with respect to other ones of the clock signals. Based on the digital control work provided from digital logic circuit 414, one of the clock signals is selected as the receiver clock, Rclk. The Rclk signal is provided to both receiver 410 and digital logic circuit 414. This selection may change as new data is received by receiver 410.

Figure 5:
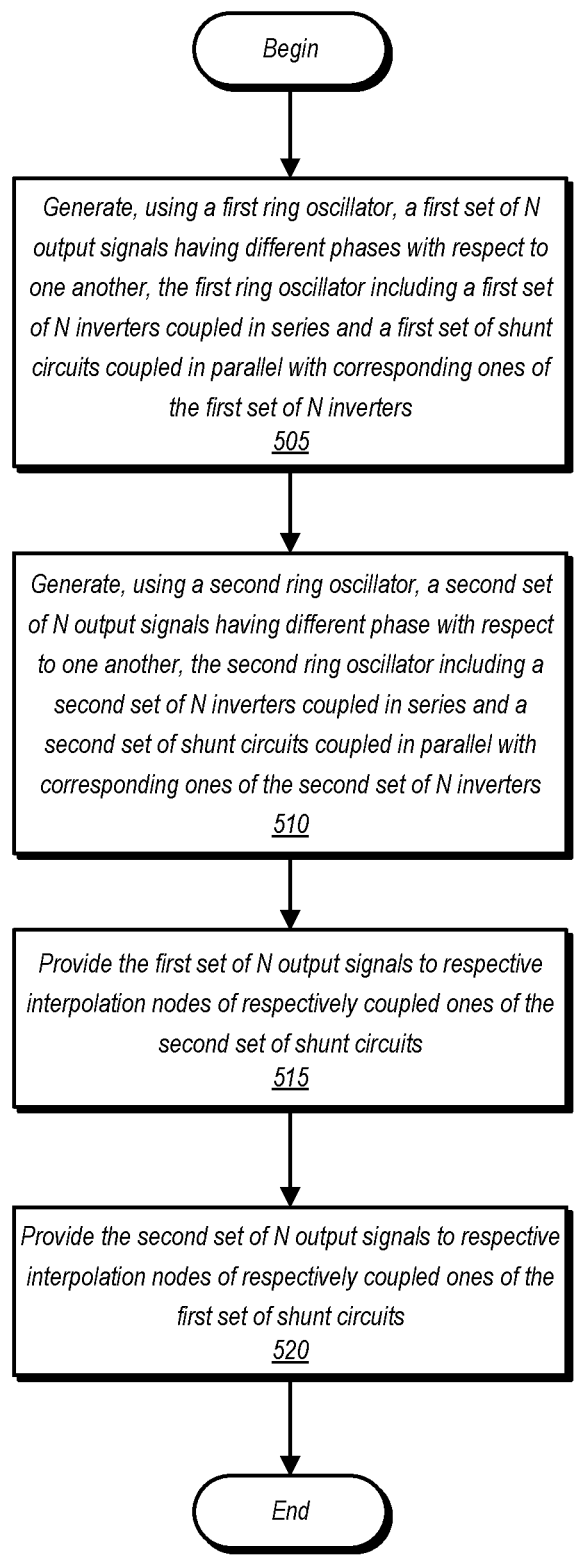
FIG. 5 is a flow diagram of one embodiment of a method for operating a multi-phase clock generation circuit.

FIG. 5 is a flow diagram of one embodiment of a method for operating a multi-phase clock generation circuit. Method 500 may be performed by various embodiments of the clock generation circuits discussed above. Clock generation circuits capable of carrying out Method 500 but not explicitly discussed herein may also fall within the scope of this disclosure.

Method 500 includes generating, using a first ring oscillator, a first set of N output signals having different phases with respect to one another, the first ring oscillator including a first set of N inverters coupled in series and a first set of shunt circuits coupled in parallel with corresponding ones of the first set of N inverters (block 505). The method further includes generating, using a second ring oscillator, a second set of N output signals having different phase with respect to one another, the second ring oscillator including a second set of N inverters coupled in series and a second set of shunt circuits coupled in parallel with corresponding ones of the second set of N inverters (block 510). As the first and second ring oscillators are coupled to one another, the method further includes providing the first set of N output signals to respective interpolation nodes of respectively coupled ones of the second set of shunt circuits (block 515) and providing the second set of N output signals to respective interpolation nodes of respectively coupled ones of the first set of shunt circuits (block 520).

In various embodiments, the method includes conveying an output signal from a first inverter implemented in the first set of N inverters into a first resistor of a corresponding shunt circuit, wherein the first resistor is coupled between an output of the first inverter and a first interpolation node. Thereafter, the method includes conveying an interpolated signal from the first interpolation node to an input of a second inverter implemented in the second set of N inverters and conveying the interpolated signal from the first interpolation node into a second resistor of the corresponding shunt circuit, and receiving an input signal from the second resistor on an input of a third inverter coupled in series with the first inverter. The output signal, the interpolated signal, and the input signal all have different phases with respect to one another.

In various embodiments of the method, a phase of the interpolated signal lags a phase of the output signal by one half of a difference between the output signal and the input signal, and wherein a phase of the input signal lags the phase of the interpolated signal by one half of the difference between the output signal and the input signal. Furthermore, a given one of first set of N output signals and the second set of N output signals have a different phase with respect to other ones of the first set of N output signals and the second set of N output signals.

Figure 6:
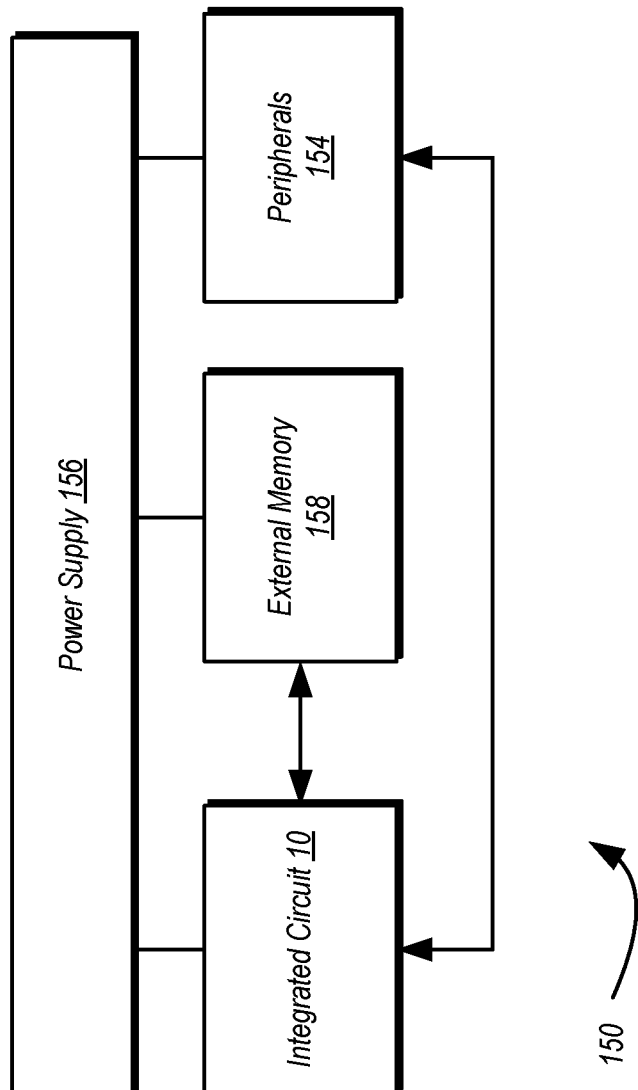
FIG. 6 is a block diagram of one embodiment of an example system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Various embodiments of system 150 may include one or more embodiments of a clock generation circuit as discussed above with reference to FIGS. 1-5. For example, integrated circuit 10 and/or peripherals 154 may include various types of circuitry in which clock signals having multiple phases may be used. Accordingly, a clock generation circuit in accordance with this disclosure having multiple ring oscillators coupled to one another and arranged to generate clock signals at a given frequency in multiple different phases may be implemented therein.

Numerous variations and modifications will become apparent to those skilled in the art once the above disclosure is fully appreciated. It is intended that the following claims be interpreted to embrace all such variations and modifications.

What is claimed is:

1. A circuit comprising:
   a first ring oscillator having a first plurality of inverters coupled in series, and a first plurality of shunt circuits implemented in parallel with corresponding ones of the first plurality of inverters; and
   a second ring oscillator having a second plurality of inverters coupled in series, and a second plurality of shunt circuits implemented in parallel with corresponding ones of the second plurality of inverters;
   wherein an interpolation node of ones of the shunt circuits of the first ring oscillator are coupled to inputs of corresponding ones of the second plurality of inverters, and wherein interpolation nodes of ones of the shunt circuits of the second ring oscillators are coupled to inputs of corresponding ones of the first plurality of inverters.

2. The circuit of claim 1, wherein ones of the first and second pluralities of shunt circuits include:
   a first resistor having a first terminal coupled to an input of a corresponding inverter of one of the first and second pluralities of inverters; and
   a second resistor having a first terminal coupled to an output of the corresponding inverter of the one of the first and second pluralities of inverters;
   wherein respective second terminals of the first and second resistors are coupled to the interpolation node of a corresponding one of the first and second pluralities of shunt circuits.

3. The circuit of claim 2, wherein the first and second resistor of shunt circuits of the first and second pluralities of shunt circuits have equal resistance values.

4. The circuit of claim 1, wherein respective outputs of ones of the first plurality of inverters are coupled to an input of another one of the first plurality of inverters, and wherein respective outputs of ones of the second plurality of inverters are coupled to an input of another one of the second plurality of inverters.

5. The circuit of claim 1, wherein a phase difference between an input signal provided to a particular one of the first and second plurality inverters and an output signal provided from the particular one of the first and second plurality of inverters is greater than 180°.

6. The circuit of claim 1, wherein the first plurality of inverters includes N inverters, and wherein the second plurality of inverters includes N inverters.

7. The circuit of claim 1, wherein the first ring oscillator is configured to generate a first set of N output signals and wherein the second ring oscillator is configured to generate a second set of N output signals.

8. The circuit of claim 7, wherein the first ring oscillator is configured to generate the first set of N output signals such that the first set of N output signals have a different phase with respect to one another, and wherein the second ring oscillator is configured to generate the second set of N output signals such that the second set of N output signals have a different phase with respect to one another.

9. The circuit of claim 8, wherein the first set of N output signals have a different phase with respect to ones of the second set of N output signals.

10. A method comprising:
    generate, using a first ring oscillator, a first set of N output signals having different phases with respect to one another, the first ring oscillator including a first set of N inverters coupled in series and a first set of shunt circuits coupled in parallel with corresponding ones of the first set of N inverters;
    generate, using a second ring oscillator, a second set of N output signals having different phase with respect to one another, the second ring oscillator including a second set of N inverters coupled in series and a second set of shunt circuits coupled in parallel with corresponding ones of the second set of N inverters;

providing the first set of N output signals to respective interpolation nodes of respectively coupled ones of the second set of shunt circuits; and providing the second set of N output signals to respective interpolation nodes of respectively coupled ones of the first set of shunt circuits.

11. The method of claim 10, further comprising:

conveying an output signal from a first inverter implemented in the first set of N inverters into a first resistor of a corresponding shunt circuit, wherein the first resistor is coupled between an output of the first inverter and a first interpolation node;

conveying an interpolated signal from the first interpolation node to an input of a second inverter implemented in the second set of N inverters;

conveying the interpolated signal from the first interpolation node into a second resistor of the corresponding shunt circuit; and receiving an input signal from the second resistor on an input of a third inverter coupled in series with the first inverter.

12. The method of claim 11, wherein the output signal, the interpolated signal, and the input signal all have different phases with respect to one another.

13. The method of claim 12, wherein a phase of the interpolated signal lags a phase of the output signal by one half of a difference between the output signal and the input signal, and wherein a phase of the input signal lags the phase of the interpolated signal by one half of the difference between the output signal and the input signal.

14. The method of claim 10, wherein a given one of first set of N output signals and the second set of N output signals have a different phase with respect to other ones of the first set of N output signals and the second set of N output signals.

15. A circuit comprising:

a clock generation circuit configured to generate a plurality of clock signals at a particular clock frequency, wherein ones of the plurality of clock signals have a different phase with respect to other ones the plurality of clock signals, wherein the clock generation circuit includes:

a first plurality of phase generation elements coupled to one another to form a first ring oscillator; and a second plurality of phase generation elements coupled to one another to form a second ring oscillator, wherein one of the first and second plurality phase generation elements include a delay element, a first resistor coupled to an input node of the delay element, and a second resistor coupled to an output node of the delay element, wherein the first and second resistors are coupled one another at an interpolation node;

wherein interpolation nodes of the first ring oscillator are coupled to corresponding input nodes of the second ring oscillator, and wherein interpolation nodes of the second ring oscillator are coupled to corresponding input nodes of the first ring oscillator.

16. The circuit of claim 15, wherein for a given one of the phase generation elements are coupled to receive at their respective input node, a signal having a first phase, and configured to output a signal having a second phase different from the first phase, and wherein its respective interpolation node is coupled to receive a signal having a third phase different from the first phase and the second phase.

17. The circuit of claim 16, wherein a difference between the first phase and the third phase is equal to a difference between the second phase and the third phase, and wherein a difference between the first phase and the second phase is twice the difference between the first phase and the third phase.

18. The circuit of claim 17, wherein the difference between the first phase and the second phase is greater than 180°.

19. The circuit of claim 15, wherein the delay elements are complementary metal oxide semiconductor (CMOS) inverters.

20. The circuit of claim 15, further comprising a phase selector configured to select one of the plurality of clock signals to be provided to a clock consumer.

* * * * *